United States Patent
Ju et al.

(10) Patent No.: US 6,170,070 B1
(45) Date of Patent: Jan. 2, 2001

(54) TEST METHOD OF CACHE MEMORY OF MULTIPROCESSOR SYSTEM

(75) Inventors: Seok-mann Ju, Sungnam; Hyun-gue Huh, Seoul, both of (KR)

(73) Assignee: SamSung Electronics Co. Ltd., Suwon (KR)

( * ) Notice: Under 35 U.S.C. 154(b), the term of this patent shall be extended for 0 days.

(21) Appl. No.: 09/084,925

(22) Filed: May 28, 1998

(30) Foreign Application Priority Data

May 28, 1997 (KR) ................................................ 97-21336

(51) Int. Cl.⁷ .................................................... G11C 29/00
(52) U.S. Cl. ........................... 714/718; 714/15; 714/720; 702/117
(58) Field of Search .................................. 714/718, 720, 714/15; 702/117

(56) References Cited

U.S. PATENT DOCUMENTS

| | | | |
|---|---|---|---|
| 4,686,621 | * 8/1987 | Keeley et al. | 714/40 |
| 4,783,736 | 11/1988 | Ziegler et al. | 711/130 |
| 4,905,141 | 2/1990 | Brenza | 711/129 |
| 4,982,402 | * 1/1991 | Beaven et al. | 714/15 |
| 5,073,891 | 12/1991 | Patel | 714/720 |
| 5,165,029 | 11/1992 | Sawai et al. | 711/3 |
| 5,247,649 | 9/1993 | Bandoh | 711/130 |
| 5,355,471 | * 10/1994 | Weight | 714/10 |
| 5,357,623 | 10/1994 | Megory-Cohen | 711/129 |
| 5,406,504 | * 4/1995 | Denisco et al. | 702/117 |
| 5,493,668 | 2/1996 | Elko et al. | 711/130 |
| 5,511,164 | * 4/1996 | Brunmeier et al. | 714/53 |
| 5,533,196 | * 7/1996 | Salmon | 714/54 |
| 5,537,635 | 7/1996 | Douglas | 711/129 |
| 5,586,279 | 12/1996 | Pardo et al. | 711/3 |
| 5,592,432 | * 1/1997 | Vishlitzky et al. | 365/230.03 |
| 5,592,616 | 1/1997 | Finch et al. | 714/42 |
| 5,623,626 | 4/1997 | Morioka et al. | 711/118 |
| 5,634,027 | 5/1997 | Saito | 711/3 |
| 5,638,382 | 6/1997 | Krick et al. | 714/733 |
| 5,644,705 | * 7/1997 | Stanley | 714/42 |
| 5,644,751 | 7/1997 | Burnett | 711/113 |
| 5,651,134 | 7/1997 | Glott | 711/118 |
| 5,666,513 | 9/1997 | Whittaker | 711/118 |
| 5,671,231 | 9/1997 | Coopper | 714/724 |
| 5,677,913 | 10/1997 | Aybay | 714/720 |
| 5,740,353 | * 4/1998 | Kreulen et al. | 714/42 |
| 5,748,897 | * 5/1998 | Kobayashi | 714/42 |
| 5,784,382 | * 7/1998 | Byers et al. | 714/726 |
| 5,913,022 | * 6/1999 | Tinaztepe et al. | 714/25 |
| 5,940,588 | * 8/1999 | Kikinis | 714/28 |
| 5,958,072 | * 9/1999 | Jacobs et al. | 714/30 |
| 6,026,501 | * 2/2000 | Hohl et al. | 714/38 |

\* cited by examiner

Primary Examiner—Trinh L. Tu
Assistant Examiner—Guy Lamare
(74) Attorney, Agent, or Firm—Robert E. Bushnell, Esq.

(57) ABSTRACT

A test method for a cache memory of a multiprocessor system. The multiprocessor system has a shared memory structure accessed via a system bus, including a multiplicity of processor modules, each acting as a master of the bus and each having a cache module, and a shared memory module for storing data shared by the processor modules. The test method includes dividing the cache memory into a test region, to be tested, and a code region, to store a program, positioning a test program in the shared memory at a place corresponding to the code region of the cache memory, and reading the test program stored in the shared memory and writing the test program in the code region of the cache memory to perform the test program. Accordingly, the total cache region is divided into a test region and a code region, and then only the test region is tested, to thereby enhance the test performance. In addition, all bus cycles between the cache and the shared memory are generated, sequentially synchronizing all the boards participating in the test, to increase the reliability of the test.

6 Claims, 8 Drawing Sheets

US 6,170,070 B1

TEST METHOD OF CACHE MEMORY OF MULTIPROCESSOR SYSTEM

CLAIM FOR PRIORITY

This application makes reference to, incorporates the same herein, and claims all benefits accruing under 35 U.S.C. § 119 from an application for TEST METHOD OF CACHE MEMORY OF MULTIPROCESSOR SYSTEM earlier filed in the Korean Industrial Property Office on the 28$^{th}$ of May 1997, and there duly assigned Ser. No. 21336/1997, a copy of which application is annexed hereto.

BACKGROUND OF THE INVENTION

1. Technical Field

The present invention relates to a cache memory test method, and more particularly, to a test method for cache memories disposed between processors and a shared memory accessed via a bus, in a multiprocessor system in which each of the processors has a cache memory.

2. Related Art

Generally, a multiprocessor system using a plurality of processors with respective cache memory connected via a system bus for accessing a shared memory via the system bus in order to attain high performance and reduce bus traffic. Exemplars of such contemporary multiprocessor systems are disclosed in U.S. Pat. No. 5,247,649 for Multi-Processor System Having A Multi-Port Cache Memory issued to Bandoh, U.S. Pat. No. 5,493,668 for Multiple Processor System Having Software For Selecting Shared Cache Entries Of An Associated Castout Class For Transfer To A DASD With One I/O Operation issued to Elko et al., U.S. Pat. No. 5,623,626 for Logical Cache Memory For Multi-Processor System issued to Morioka et al., U.S. Pat. No. 5,634,027 for Cache Memory System For Multiple Processors With Collectively Arranged Cache Tag Memories issued to Saito, and U.S. Pat. No. 5,666,513 for Automatic Reconfiguration Of Multiple-Way Cache System Allowing Uninterrupted Continuing Processor Operation issued to Whittaker.

As the number of processors accessing a system bus increases, competition for the right to use the system bus increases. Likewise, as the processing speed of processors increases, the difference in the processing speeds between the processors and the system bus increases. Therefore, a cache memory of high speed is typically included in each processor of the multiprocessor system. The cache memory is a hardware resource disposed between the processor and the shared memory for temporarily storing data obtained from the shared memory. The access speed of the cache memory must be high. Accordingly, the processor need not always access the shared memory through the system bus, and the use of the cache memory reduces the competition for the right to use the system bus and increases the use efficiency of the system bus. In a multiprocessor system for performing various programs, the cache memory of the respective processor also stores data shared between the processors. Consequently, modification of data in the cache memory must be informed to other processors, such that data consistency of the cache memories is maintained.

For example, if data of the shared memory is to be stored in the cache memory, the processor must first modify the data and observe whether other processors require the modified data. If another processor requires the modified data, the processor having modified the data must prevent other processors from accessing the shared memory, and then write the modified data to the shared memory, before allowing other processors to access the shared memory. Maintaining data consistency of the cache memory requires elaboration and stable operation. Therefore, it is very important in aspects of system stabilization and development period reduction to effectively and rigorously test the cache memory.

A test program is generally stored in the shared memory for testing the cache memory. Examples of contemporary testing techniques for the cache memory are disclosed in U.S. Pat. No. 5,073,891 for Method And Apparatus For Testing Memory issued to Patel, U.S. Pat. No. 5,165,029 for Cache Memory With Test Function issued to Sawai et al., U.S. Pat. No. 5,586,279 for Data Processing System And Method For Testing A Data Processor Having A Cache Memory issued to Pardo et al., U.S. Pat. No. 5,592,616 for Method For Performing Efficient Memory Testing On Large Memory Arrays Using Test Code Executed From Cache Memory issued to Finch et al., U.S. Pat. No. 5,638,382 for Built-In Self Test Function For A Processor Including Intermediate Test Results issued to Krick et al., and U.S. Pat. No. 5,671,231 for Method And Apparatus For Performing Cache Snoop Testing On A Cache System issued to Cooper. Generally, the test program for testing the cache memory is first read from the shared memory and stored in a certain code region of the cache memory. Then, the test program is executed to test the cache memory. At this time, while the test program is executed, data may be written to the code region of the cache memory where the test program is stored, to thereby flush the test program. In order to repeatedly test the cache memory, the processor must read out the test program of the shared memory which extends the time for testing the cache memory. In addition, additional load is required for hardware logic to maintain data consistency of the cache memory, if the cache memory test is reliable.

SUMMARY OF THE INVENTION

Accordingly, it is therefore an object of the present invention to provide a multiprocessor system comprising a plurality of processors provided with a test function for testing a cache memory.

It is also an object to provide a test method for effectively testing a cache memory of a multiprocessor system having a shared memory accessed via a system bus.

These and other objects of the present invention can be achieved by a test method for a cache memory of a multiprocessor system having a plurality of processor modules and a shared memory accessed via a bus with each processor module acting as a master of the bus and having a cache module. The test method includes dividing the cache memory into a test region, to be tested, and a code region, to store a test program; positioning the test program from the shared memory at a corresponding code region of the cache memory; and reading the test program stored in the shared memory and writing the test program in the code region of the cache memory to perform the testing of the cache memory.

The test program includes a program executing module for initiating the cache memory test, and a test program module satisfying protocol for maintaining data consistency of the cache memory and for generating a bus cycle such that the maximum load is placed on hardware between the cache memory and the shared memory according to a state of the cache memory, to test the cache memory. In addition, the test program further comprises a synchronization module for determining the number of processor modules participating in the cache memory test and synchronizing the processor modules to add heavy load to the cache memory, and an error process module for storing and controlling error information when errors occur during the cache memory test.

Preferably, in the case that modules 'RQ' each acting as a bus master of the multiprocessor system have predetermined series of numbers, the synchronization performed by the synchronization module comprises the steps of: initializing a sync-flag value stored in the shared memory; setting the sync-flag value according to the number of modules 'RQ' acting as bus masters of the multiprocessor system, and determining whether the sync-flag value is equal to the assigned number of the modules 'RQ', and if so, reducing the sync-flag value by a predetermined value, and if not, checking the sync-flag value until the sync-flag value equal to an initial value.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
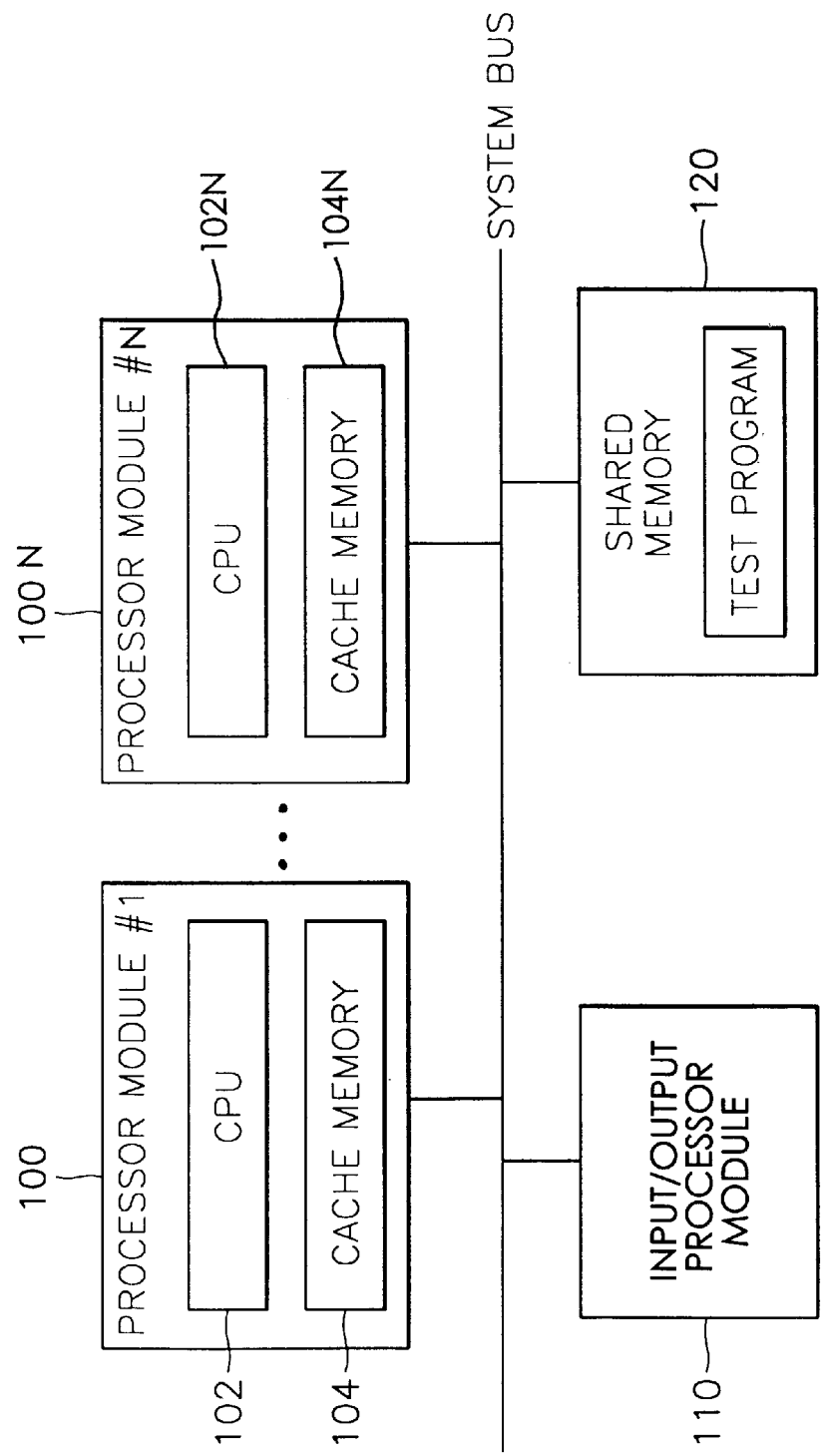
FIG. 1 illustrates a typical structure of a multiprocessor system.

Referring now to the drawings and particularly to FIG. 1, which illustrates a typical structure of a multiprocessor system. The multiprocessor system includes a plurality of processor modules 100–100N, an input/output processor module 110 and a shared memory 120 connected through a system bus 130. Each processor module includes a central processing unit (CPU) 102 and a cache memory 104.

The test of the cache memory 104 is typically performed as follows. A test program for testing the cache memory is read from the shared memory 120 and stored in the cache memory 104. Here, a code region, where the test program is stored, and other test regions exist in the cache memory 104. Then, the test program is executed to test the cache memory. At this time, while the test program is executed, data may be written to the code region of the cache memory 104 where the test program is stored, to thereby flush the test program. In order to repeatedly test the cache memory, the CPU must read out the test program of the shared memory 120 which extends the time for testing the cache memory 104. In addition, additional load is required for hardware logic to maintain data consistency of the cache memory 104, if the cache memory test is reliable.

A function for mapping blocks of a shared memory 120 to a cache memory 104 is important in the design of the cache memory 104. The data of the shared memory is stored in the cache memory in data transmission units of a predetermined size. The data transmission unit is a typical slot unit of the cache memory. For example, supposing that the cache memory size is 16 KB, the shared memory size is 16 MB, and the data transmission unit is 4 byte, the cache memory has $4 \times 2^{10}$(4 K) slots and the shared memory has $4 \times 2^{20}$(4 M) blocks. Accordingly, an algorithm for mapping the blocks of the shared memory to the slots of the cache memory is necessary, so is the determination of which block of the shared memory occupies the slot of the cache memory. The mapping is classified as either direct mapping, associative mapping, or set associative mapping.

Direct mapping is very simple. Each block of the shared memory can only be stored in a certain slot of the cache memory. Accordingly, when the CPU must repeatedly read out data from two blocks which map to the same slot, the blocks must be repeatedly swapped in the cache, which causes deterioration of a hit rate of the cache memory.

Associative mapping is an attempt to solve the problems of direct mapping. By associative mapping, each block of the shared memory can be stored in any slot. Accordingly, it is easy to swap blocks to reading a new block in a cache memory. However, a complicated circuit for parallel checking tags of slots of all cache memories is necessary.

Set associative mapping combines advantages of direct mapping and associative mapping. By set associative mapping, the cache memory includes several sets, where the number of the sets is equal to that of the cache slots.

A mapping formula for the three mapping is expressed as follows:

$$L_1 = (A_g/L) \bmod (S_c/(L*W)), \quad \text{(Formula 1)}$$

where '$L_t$' indicates a target cache set number, '$A_g$' indicates a given shared memory address, 'L' indicates a line (slot) size, '$S_c$' indicates a cache memory size, and 'W' indicates the number of slots per set, for example, w=1, in the case of the direct mapping.

Figure 2B:
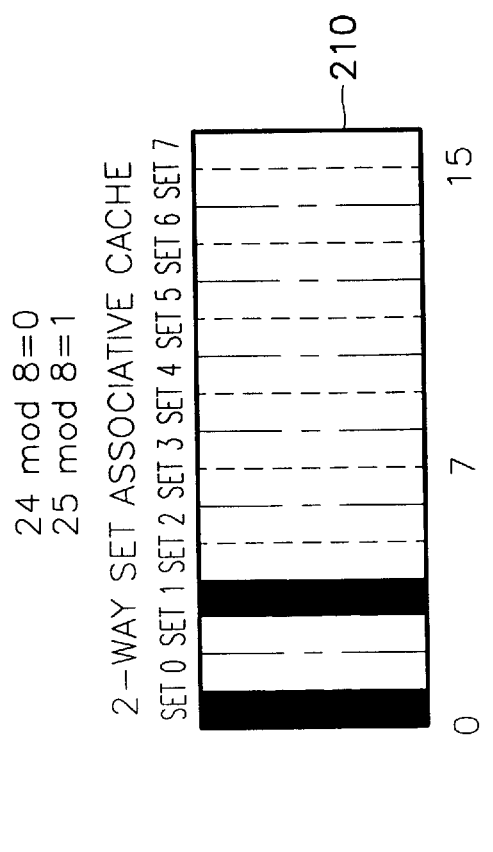
FIGS. 2A–2C illustrate data of a shared memory mapped onto a cache memory by using a mapping formula.
Figure 2A:
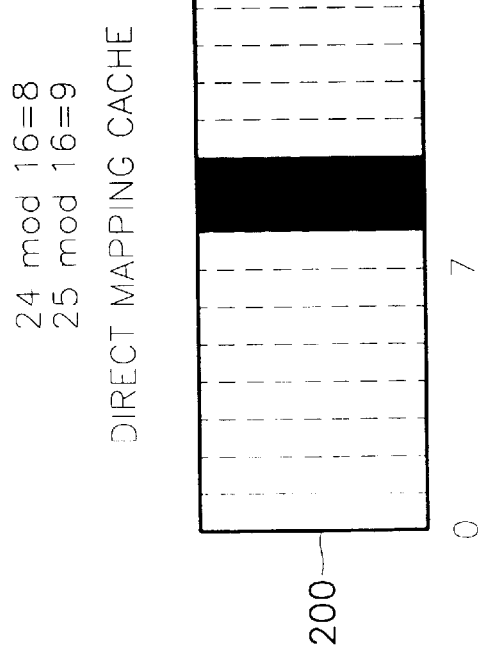
Figure 2C:
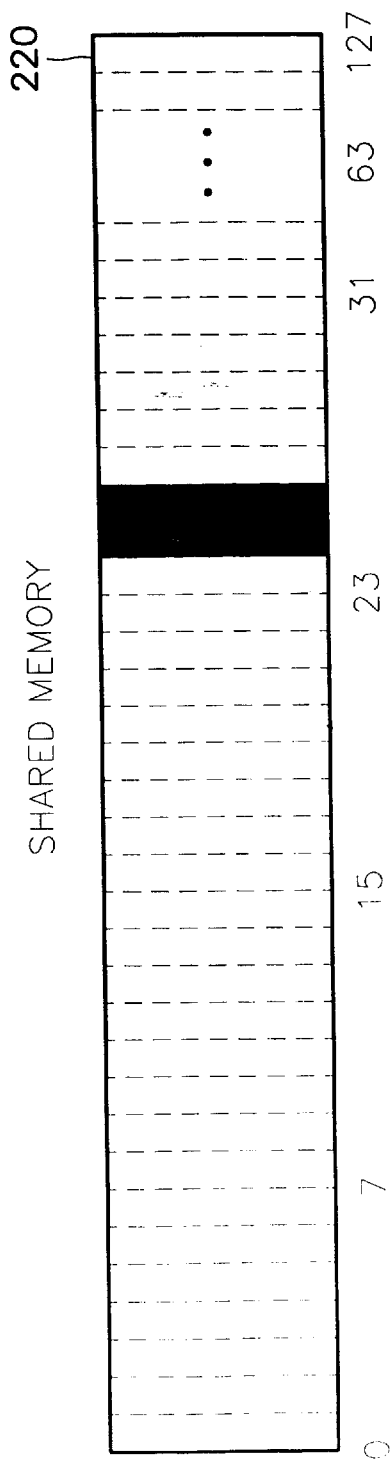

FIGS. 2A and 2B illustrate a cache memory mapping in case of a direct mapping 200 and a 2-way set associative mapping 210 (2 slots per set) with a line size of 64 B, a cache memory size of 1 KB, and a shared memory size of 8 KB. FIG. 2C illustrates the configuration of a shared memory 220 with a black region has a cache memory mapping 200, in the case of direct mapping, and a cache memory mapping 210 in the case of the 2-way set associative mapping (2 slots per set).

Figure 3:
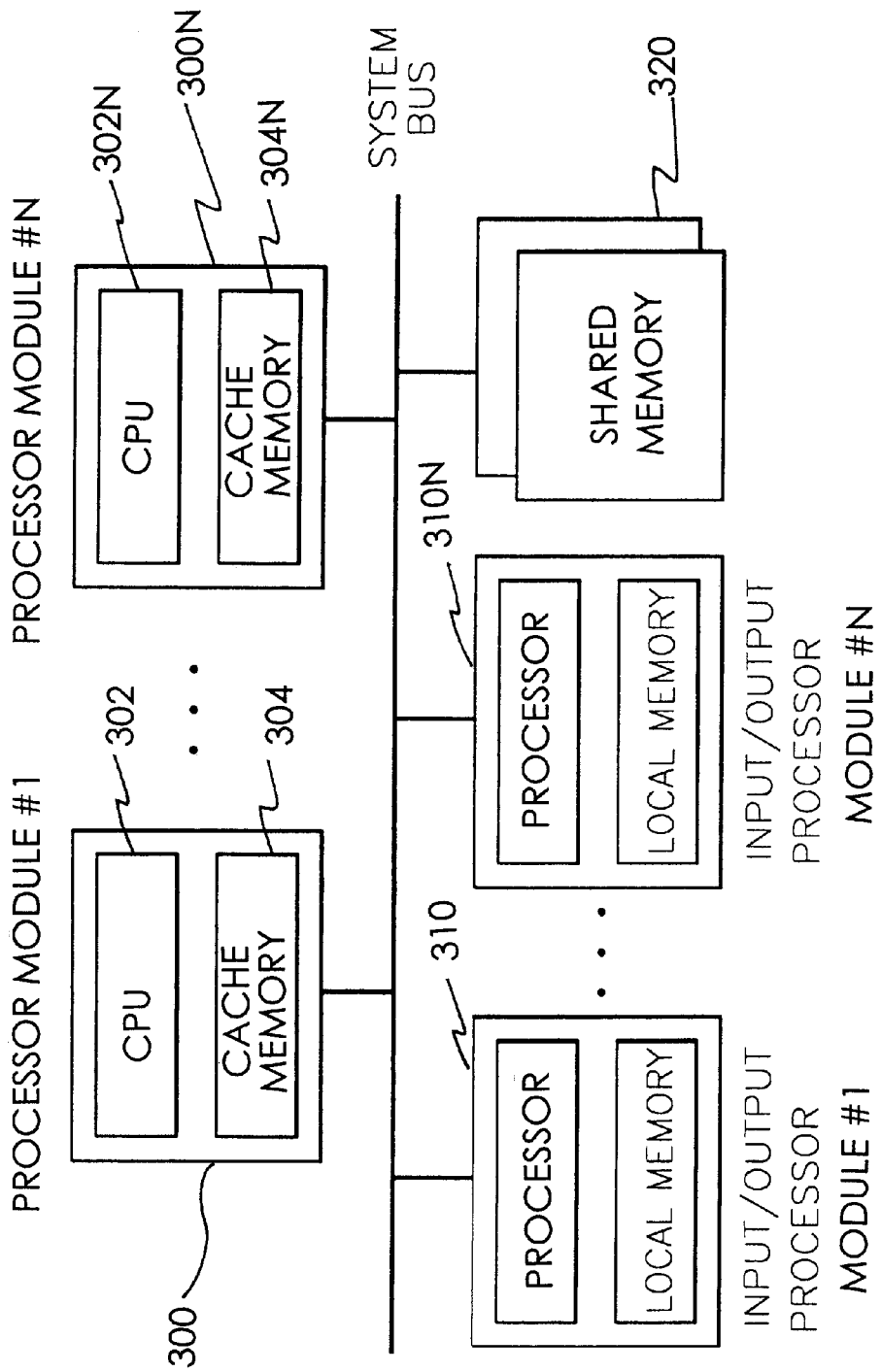
FIG. 3 illustrates a structure of a multiprocessor system using a test method for a cache memory according to the principles of the present invention.

Turning now to FIG. 3, which illustrates a structure of a multiprocessor system using a test method for a cache memory according to the principles of the present invention. The multiprocessor system includes a plurality of processor modules 300–300N, a shared memory 320, and a plurality of input/output processor modules 310–310N which can extend to 8 boards, 4 boards, and 4 boards, respectively. A write policy for maintaining data consistency of a cache memory uses a write back method. A system bus uses a pended protocol, and the bus cycle is divided into an address cycle and a data cycle. A snoop protocol uses a modified, exclusive, shared, and invalid (MESI) protocol for maintaining data consistency of the cache. A replace algorithm uses a least recently used (LRU) method. Also, two-way set associative mapping is used.

According to the cache memory test method of the present invention, the cache memory 304 of the processor module is divided into a test region to be tested and a code region where a cache memory test program is stored. Then, the test program stored in the shared memory 320 is stored to correspond to the test program region of the cache memory 304.

Figure 4:
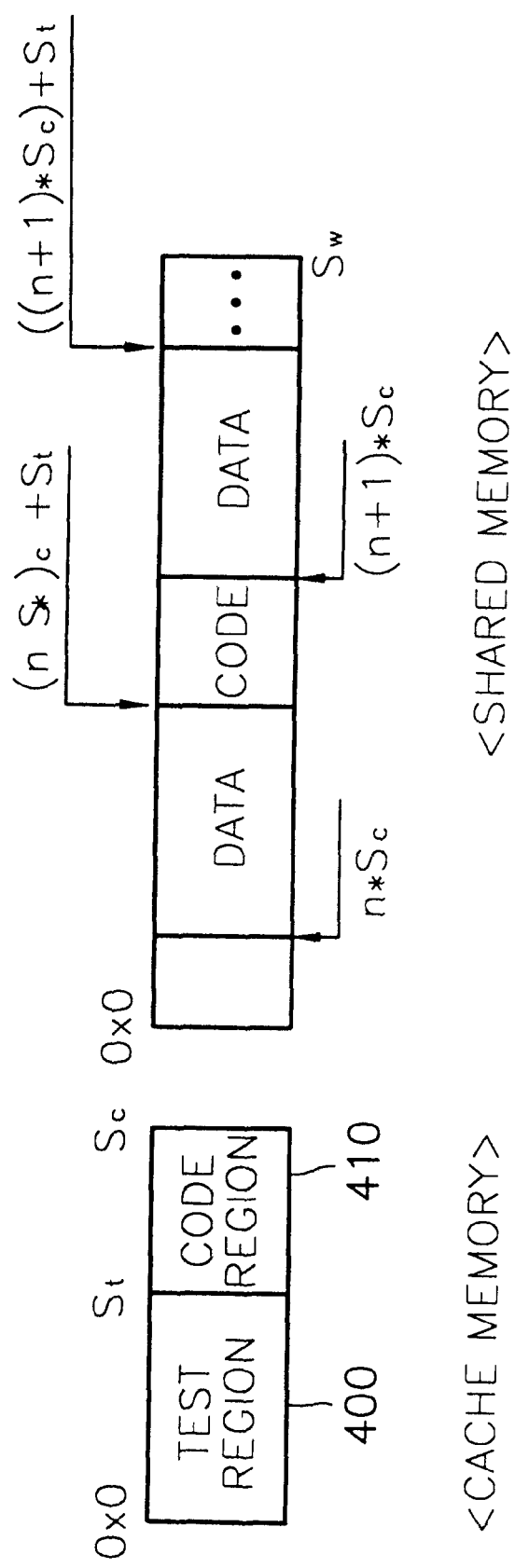
FIG. 4 illustrates region division of a cache memory using a direct mapping method and the position of a test program for a shared memory.
Figure 5:
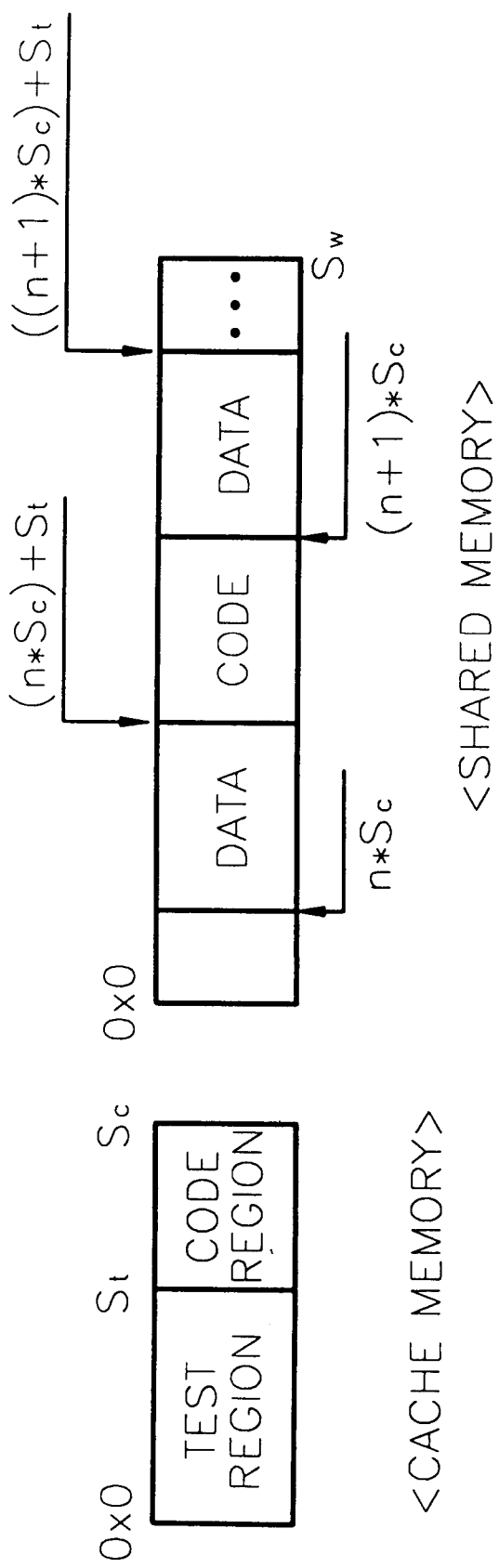
FIG. 5 illustrates region division of a cache memory using a 2-way set associative mapping method and the position of a test program for a shared memory.

Referring to FIG. 4, the cache memory region is divided into a test region 400 and a code region 410. Here, a cache memory size '$S_c$'=1 MB, a code space '$S_i$'=240 KB, and a shared memory size $S_M$=1 GB. In the case of direct mapping, an actual test space '$S_t$'=786 KB, and a code space '$S_i$'=262 KB. Referring to FIG. 5, test conditions are equal to those of FIG. 4, and in the 2-way set associative mapping, the actual test space '$S_t$' is 512 KB, and a code space '$S_i$' is 512 KB. When the region of the cache memory is divided, and the test program is positioned in the shared memory 320 to correspond to the divided region, the test load of the cache memory 304 is maximized, and a cache related bus cycle due to cache flush during test of the cache memory is not required.

Meanwhile, as shown in FIGS. 4 and 5, the test program is positioned in the shared memory 320, and then the test program is read out from the shared memory 320, and stored in the code region of the cache memory 304. Then, the test program is executed to test the cache memory 304 according to test steps programmed in the test program.

In detail, a master board performs synchronization such that other boards simultaneously perform the cache memory test. At this time, cache functions of all boards connected to the shared memory are tested. If errors are generated during the test, the board where the error is generated stores information of the error in the shared memory in a predetermined form. The master board checks whether any error is generated, at every synchronizing point, and if error is generated, stops the test of all boards, and then displays the error information on an output device.

Figure 6:
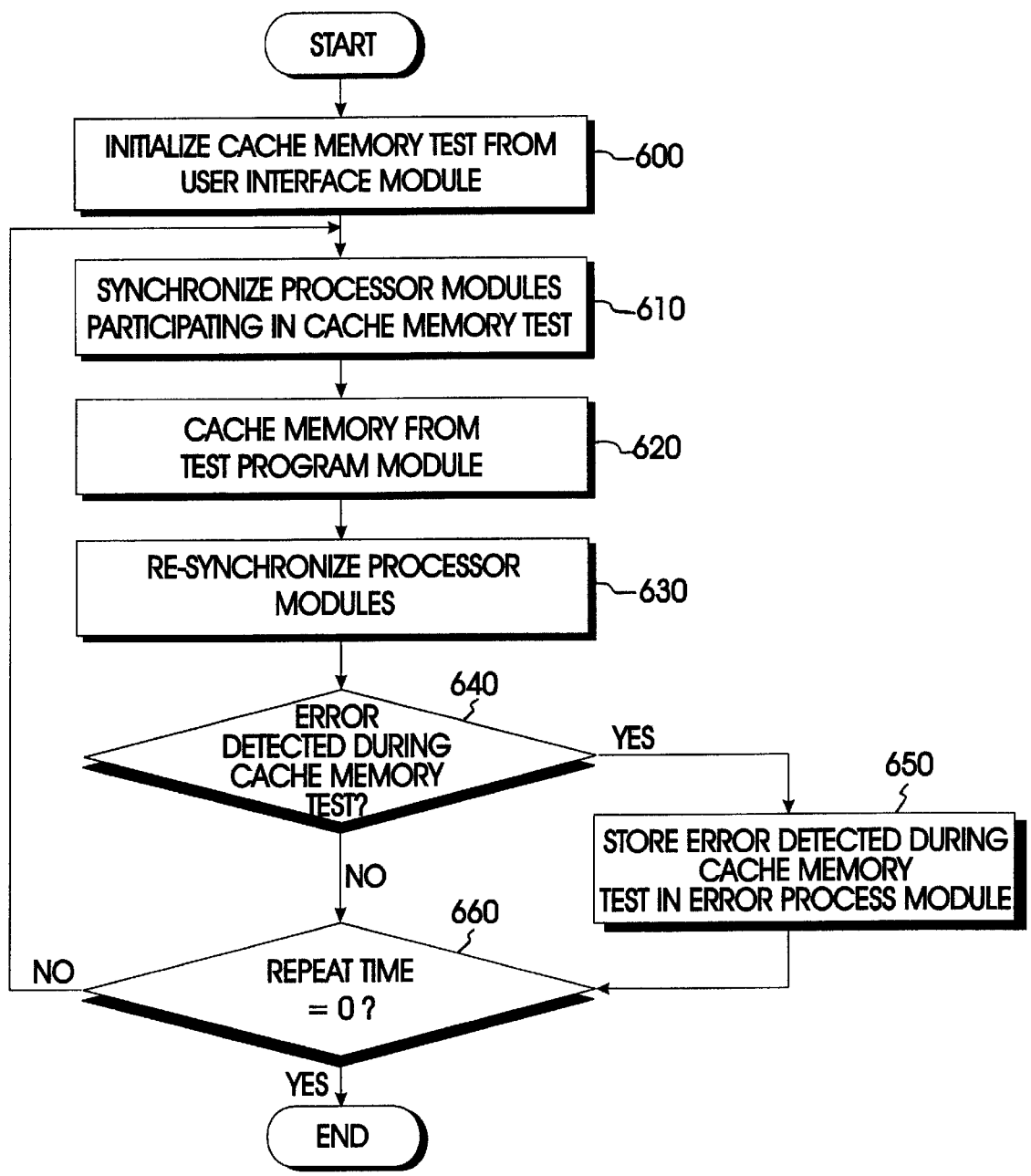
FIG. 6 is a flow chart of function blocks for cache memory test.

Referring to FIG. 6, a test program for testing the cache memory includes a user interface module, a test program module, a synchronization module, and an error process module. The user interface module includes a program performer for initiating the test program, and receives cache information from the user to initialize the cache memory test at step 600. The cache information indicates a cache size, a line size, a cache mapping method, and a start address and end address of the shared memory.

Figure 7:
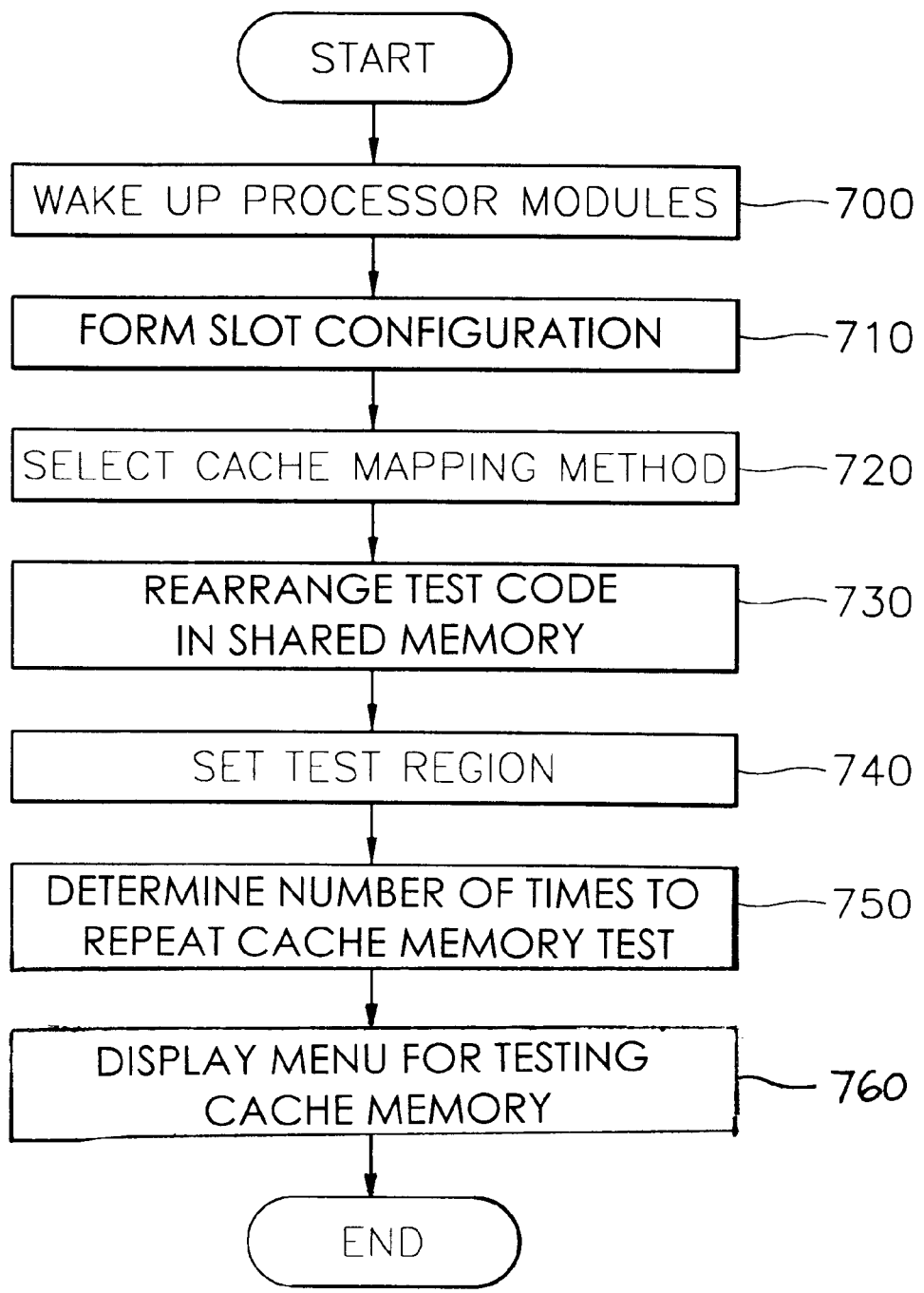
FIG. 7 is a flow chart of the operation of a user interface module.

This step is now described in detail with reference to FIG. 7. First, the processor modules receive an interrupt for wake up at step 700. Then, a configuration of the slots where the processor modules are mounted is formed at step 710. After a cache mapping method is selected at step 720, the test code is rearranged in the shared memory 320 at step 730, and a test region is set at step 740. The number of times to repeat the testing of the cache memory is determined at step 750, and then a menu for testing the cache memory is displayed at step 760.

Figure 8:
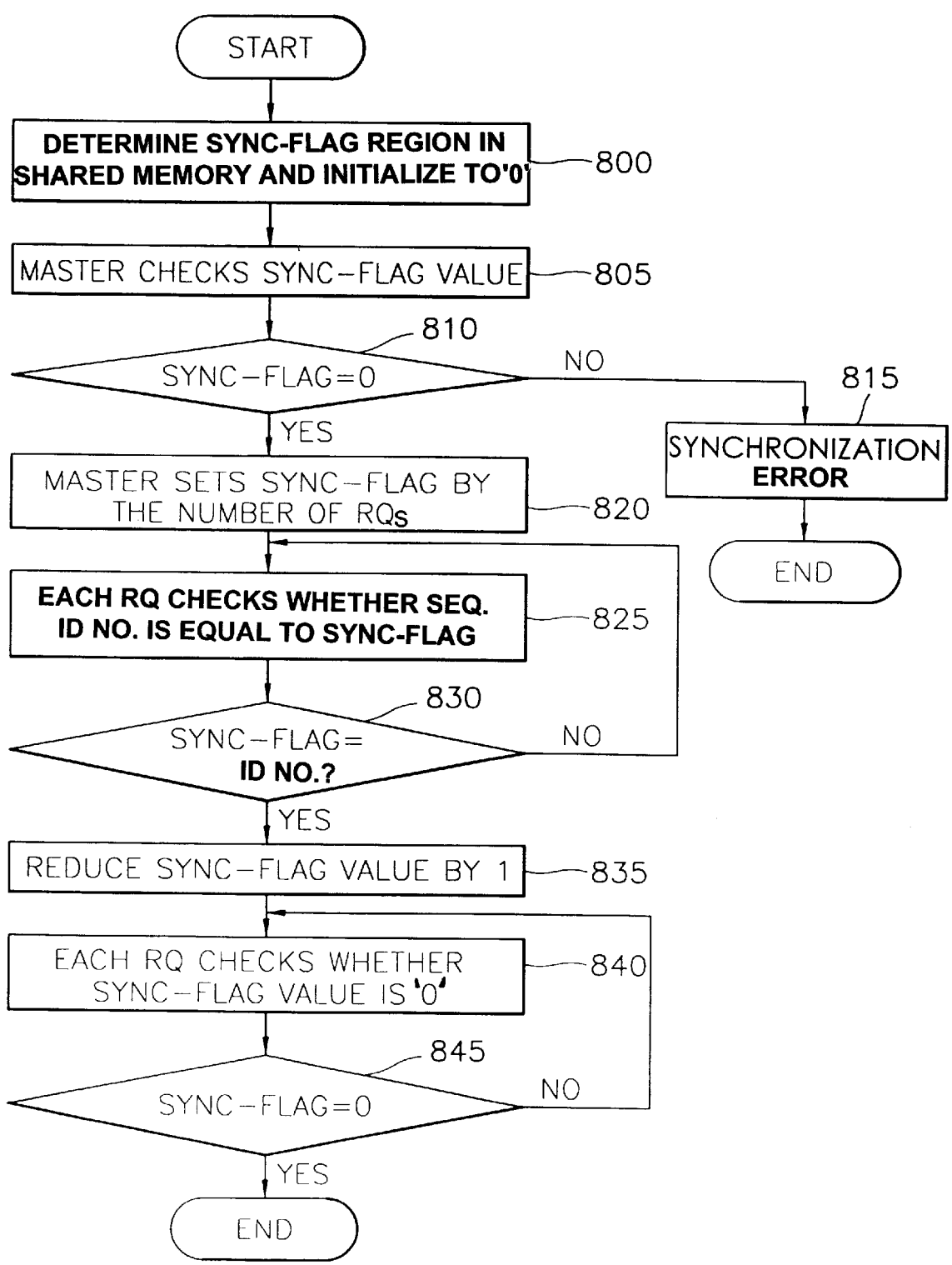
FIG. 8 is a flow chart of the operation of synchronization of a synchronization module.

Next, the synchronization module determines the number of processor modules participating in the cache memory test, and synchronizes the processor modules to add heavy load to the cache memory at step 610. This step is now described in more detail with reference to FIG. 8. A predetermined region is set in the shared memory 320 to store a sync-flag value indicating synchronization, and initialized to zero ('0') at step 800. Then, a master for testing the cache memory reads the sync-flag value at step 805, in order to determine whether the sync-flag value is zero ('0') at step 810. If the sync-flag value is not zero, the value is processed as a synchronization error at step 815. If the sync-flag is zero however, the master sets the sync-flag value by the RQ number of RQs at step 820. Here, the 'RQ's are boards acting as a bus master capable of requesting use of a system bus in the multiprocessor system, and have sequential identification numbers. For example, in the case of 5 RQs, the numbers of the RQs are 1 to 5. However, each RQ compares its identification number to the sync-flag value at step 825, and if they are equal at step 830, the RQ reduces the sync-flag value by one ('1') at step 835. The RQs then repeatedly check until the sync-flag value is '0', to thereby establish synchronization (steps 840 and 845).

Refer back to FIG. 6, the test program module then satisfies protocol for maintaining data consistency of the cache memory, and generates a bus cycle such that the maximum load is placed on hardware between the cache memory and the shared memory according to a state of the cache memory 304, to test the cache memory at step 620. Synchronization is again established at step 630.

The error process module stores and controls information at step 650, when error is generated during the test process at step 640. When the cache memory test by test program is performed, all processors transmit program performed with respect to data comparison error and bus cycle errors to an error process module. Then, the error process module stores information of the errors in a predetermined region of the shared memory, in the predetermined form.

According to the present invention, the cache total region is divided into a test region and a test program region, and then only the test region is tested, to thereby enhance the test performance. In addition, all bus cycles between the cache memory and the shared memory are generated, sequentially synchronizing with all boards participating in the test, to increase reliability of the test program.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. In a test method for a cache memory of a multiprocessor system, said system having a plurality of processor modules and a shared memory accessed via a bus, each of said processor modules having a cache module, said test method comprising the steps of:

dividing the cache memory into a test region, to be tested, and a code region, to share a test program;

positioning the test program from the shared memory at a corresponding code region of the cache memory; and reading the test program stored in the shared memory and writing the test program in the code region of the cache memory to perform the testing of the cache memory;

the improvement comprising: each of said processor modules acting as a master of the bus and performing said step of positioning the test program from the shared memory at a corresponding code region of the cache memory via a bus master configuration.

2. The test method of claim 1, wherein said test program comprises:

a program executing module for initiating the test program; and a test program module satisfying protocol for maintaining data consistency of the cache memory, and for generating a bus cycle such that a maximum load is placed on hardware between the cache memory and the shared memory according to a state of the cache memory, to test the cache memory.

3. The test method of claim 2, wherein said test program comprises a synchronization module for determining the number of processor modules participating in the cache memory test, and for synchronizing the processor modules to add a heavy load to the cache memory.

4. The test method of claim 3, wherein said test program comprises an error process module for storing and controlling error information when errors occur during the test.

5. The test method of claim 3, wherein, when synchronization of the processor modules is carried out to add a heavy load to the cache memory, the following steps are performed:

initializing a sync-flag value stored in the shared memory;

setting the sync-flag value according to the number of modules acting as bus masters of the multiprocessor system; and checking whether the sync-flag value is equal to the assigned number of the modules;

when the sync-flag value is equal to the assigned number of the modules, reducing the sync-flag value by a predetermined value; and when the sync-flag value is not equal to the assigned number of the modules, checking the sync-flag value until the sync-flag value is equal to an initial value.

6. The test method of claim 2, wherein said test program comprises an error process module for storing and controlling error information when errors occur during the test.

* * * * *

UNITED STATES PATENT AND TRADEMARK OFFICE
CERTIFICATE OF CORRECTION

| | | |
|---|---|---|
| PATENT NO. | : 6,170,070 B1 | Page 1 of 1 |
| APPLICATION NO. | : 09/084925 | |
| DATED | : January 2, 2001 | |
| INVENTOR(S) | : Seok-Mann Ju et al. | |

It is certified that error appears in the above-identified patent and that said Letters Patent is hereby corrected as shown below:

Title Page, Item

(56) References Cited

U.S. PATENT DOCUMENTS please add:

-- 5,793,941 *   8/1998   Pencis et al   714/5 --

Signed and Sealed this

Twenty-ninth Day of May, 2007

JON W. DUDAS
*Director of the United States Patent and Trademark Office*